United States Patent [19]

Dändliker et al.

[11] 4,225,241
[45] Sep. 30, 1980

[54] METHOD AND APPARATUS FOR ADJUSTING THE RELATIVE POSITIONING OF PLANAR TRANSPARENT OBJECTS, SUCH AS THE GLASS PLATES OF A LIQUID CRYSTAL DISPLAY, AND A LIQUID CRYSTAL DISPLAY ADJUSTED BY THE METHOD AND APPARATUS

[75] Inventors: René Dändliker, Oberrohrdorf; Otto Lanz, Niederrohrdorf, both of Switzerland; Francois Mottier, Hartford, Conn.

[73] Assignee: BBC Brown Boveri & Company Limited, Baden, Switzerland

[21] Appl. No.: 862,604

[22] Filed: Dec. 20, 1977

[30] Foreign Application Priority Data

Dec. 23, 1976 [CH] Switzerland .................. 16243/76

[51] Int. Cl.² ............................................. G01B 11/14
[52] U.S. Cl. ................................................ 356/400
[58] Field of Search ............... 356/399, 400, 401, 150, 356/129; 250/201

[56] References Cited

U.S. PATENT DOCUMENTS

4,062,623  12/1977  Suzuki et al. ..................... 356/401

FOREIGN PATENT DOCUMENTS

2347534  7/1974  Fed. Rep. of Germany ........... 356/400

OTHER PUBLICATIONS

Harper et al., "Aligning and Inpsecting Microelectronic Circuits", *IBM Technical Disclosure Bulletin*, vol. 13, No. 4, Sep. 1970, pp. 1028-1029.
Abraham et al., "Reverse Dark Field Lens", *IBM Technical Disclosure Bulletin*, vol. 19, No. 9, Feb. 1977, pp. 3417-3418.

*Primary Examiner*—John K. Corbin
*Assistant Examiner*—R. A. Rosenberger
*Attorney, Agent, or Firm*—Oblon, Fisher, Spivak, McClelland & Maier

[57] ABSTRACT

A method and apparatus for adjusting the relative positioning of planar transparent objects, such as the two glass plates of a liquid crystal display, (LCD). Textured transparent markings are disposed on the planar transparent objects. Thereafter a collimated light beam is passed through the transparent textured markings and refracted thereby. Images of the textured markings are observed and detected, whereupon the relative positioning of the planar transparent objects is adjusted until the detected images are aligned in a predetermined spatial orientation. Also disclosed is a novel liquid crystal display having the transparent textured markings provided on the transparent electrode layers of the LCD device.

14 Claims, 4 Drawing Figures

METHOD AND APPARATUS FOR ADJUSTING THE RELATIVE POSITIONING OF PLANAR TRANSPARENT OBJECTS, SUCH AS THE GLASS PLATES OF A LIQUID CRYSTAL DISPLAY, AND A LIQUID CRYSTAL DISPLAY ADJUSTED BY THE METHOD AND APPARATUS

BACKGROUND OF THE INVENTION

1. Field of the Invention

The present invention relates to a method of adjusting plane objects relatively to each other, more particularly two glass plates of a liquid crystal display (LCD) device provided with transparent layer electrodes, to an apparatus for performing the method, and to an LCD device adjusted by the method.

2. Description of the Prior Art

During the production of LCD devices it is necessary to bring two glass plates, which are provided with transparent electrodes applied by vapour deposition and textured by etching, into mutual coincidence with an accuracy of approximately 20-50 $\mu$m. Due to insufficient glass breaking accuracy, the textured electrodes do not lie in a definite position with respect to the edge of the glass, so that mere adjustment to a stop by no means fulfills the requisite positioning accuracy. Also, the application of visible reference points, e.g. by printing, to serve as alignment guides having a definite position with respect to the electrode geometry, is excluded because of technological considerations.

SUMMARY OF THE INVENTION

Accordingly, one object of this invention is to provide a novel method and apparatus for aligning the glass plates of LCD devices, and also other plane objects, mutually with an accuracy of at least 50 $\mu$m, but preferably of 20 $\mu$m, without having recourse to measures which deteriorate the transparency.

Another object of this invention is to provide a novel LCD device produced by the methods and apparatus of the invention.

These and other objects are achieved according to the invention by providing each plane object, in order to determine its position and in order to generate a local phase modulation of light passing through the plane object, with transparent textured markings; arranging the plane objects on a mechanical adjusting device and emerging them into the optical path of the light emitted from a luminous source, thereby rendering the resulting images of mutually corresponding markings visible; determining the position of the objects by detecting the images thereof; and aligning and fixing the plane objects. A device is provided for illuminating the transparent markings of the objects to be adjusted with collimated light, for imaging the markings by means of the locally phase modulated light emitted from the markings in the image plane of a dark field arrangement, for detecting the images of the markings, and for determining the positions of the objects. An LCD device adjusted according to the invention is characterized by the fact that each of its glass plates exhibits at least one transparent textured marking.

It is possible according to the invention to adjust without particular difficulty the relative position of plane objects, such as the glass plates of LCD devices, to an accuracy of better than 20 $\mu$m and at the same time to dispense entirely with the visible reference points which were heretofore necessary.

An advantageous embodiment of the invention is to make the images of mutually corresponding markings visible in a dark optical field of the optical adjusting device and to determine the position of the objects by detection of the images in the image plane of the dark field. Such a method promotes not only a reliable and rapid and therefore economical production of LCD devices, but furthermore also a particularly accurate adjustment of the glass plates. A further overriding advantage is that the markings are invisible in the finished display device.

It is particularly favorable to place the objects in the mechanical adjusting device so that they are independently moveable with respect to each other, parallel and at an interval of not more than 1 mm from each other, because in this way only the relative position of the objects is a source of error, thereby eliminating the errors resulting from the co-ordinate determination of the individual objects.

A detection of the imaged markings in the image plane of the dark optical field is to be recommended by means of either a camera tube or a differential photodiode preferably operated in short-circuit. Because this method integrates at least partially over the imaging of the markings, minor irregularities such as may arise e.g., from the etching of the markings, are averaged out. When the differential photodiode is operated as a half-bridge and is adjusted to zero output signal, fluctuations in the illumination or in the refraction efficiency of the marking have no influence upon the accuracy of the method.

Markings with periodic structure, more particularly strips patterns having stripes arranged mutually parallel and at common intervals of approximately 10 times the wavelength of the light emitted by the luminous source, are particularly suitable for the performance of the method according to the invention. Such structures, because of the fine graduation required, are better and more reproducibly produced than more complicated structures. These structures, when compared to non-periodic structures, furthermore facilitate a space frequency bandpass filtering, which is evidenced by an improved signal-to-noise ratio.

It is highly recommended, in the production of LCD devices to etch the markings in the same work stage during which the electrode layers of each glass plate are produced, because in this way the realization of the markings is achieved practically without any additional cost outlay. In this context it is irrelevant whether the structures are etched in positive or negative form.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
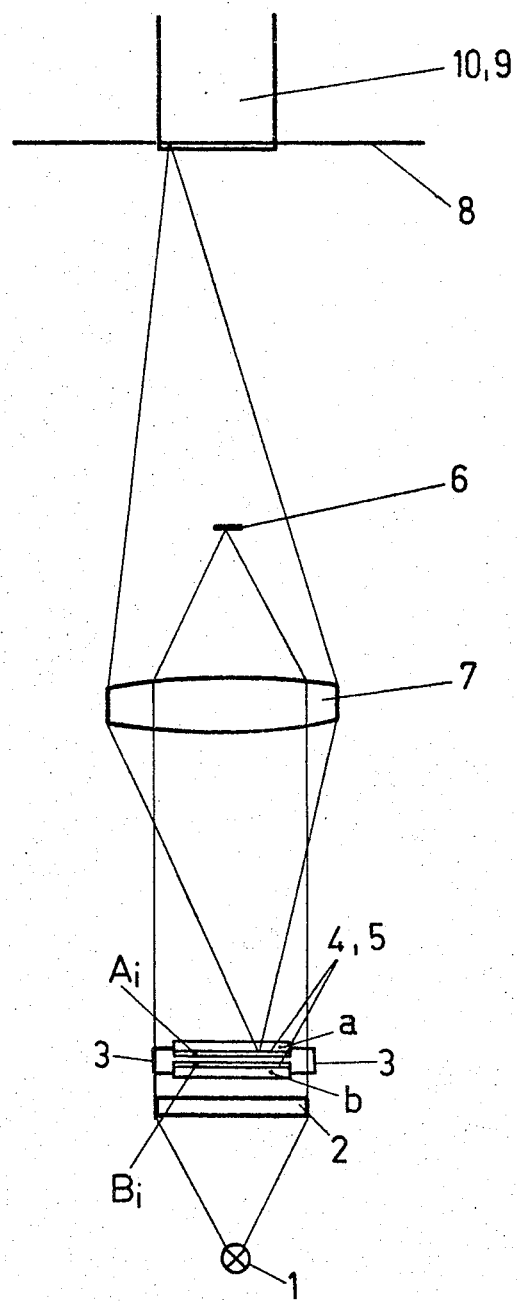
FIG. 1 is a schematical view of the optical beam path in an apparatus for adjusting two glass plates of an LCD device provided with transparent markings.

Referring now to the drawings, wherein like reference numerals designate identical or corresponding parts throughout the several views, and more particularly to FIG. 1 thereof, there is seen a luminous source 1, the light of which, after collimation in a condensing lens 2, passes through two glass plates a and b arranged in a mechanical adjusting device 3. Glass plates a and b are independently moveable with respect to each other, and are mutually parallel and separated at common intervals of approximately 0.3 mm.

Both the glass plates have a rectangular configuration with edge lengths of 10 and 30 mm respectively and exhibit on their mutually confronting surfaces textured electrodes 4 (main electrode), and 5 (return electrode) each of which has three markings $A_1$ or $B_1$, where $i = x, y, \phi$. An exemplary disposition of the three markings of the plate a (carrier of the main electrode) may be seen in FIG. 2. The markings $A_x$ and $A_y$ facilitate the translational adjustment in the direction of the edges of the glass designated by the co-ordinates x and y, whereas the marking $A\phi$ determines the rotation of the plate about a fixed point, e.g., about one of the two marks $A_x$ or $A_y$.

The markings $B_i$ on the glass plate b (carrier for the return electrode), are correspondingly disposed, but about a desired value $\Delta N_i$, e.g., 0.5 mm, in the direction of the ordinates associated with the i-th pair of markings. In each case, periodic structures of equal dimensions and rectangular configuration are provided as markings. In all investigations, the preferred structure was a stripe pattern having the configuration of an optical grid with stripe intervals of approximately 25 $\mu$m for a stripe height of approximately 100 $\mu$m and a length of approximately 300 $\mu$m. The markings $A_i$, $B_i$ were etched into the plane electrode layers of tin dioxide fitted on the glass plates in the same work stage with the textured electrodes 4, 5.

After passing through the two glass plates the light emitted from the luminous source 1 is imaged by the objective 7 onto a dark field stop 6. Only the light refracted by the textured markings $A_i$, $B_i$ enters the image plane 8 of a dark field. The texturing of the markings $A_i$, $B_i$ in fact causes a refraction of the incident light due to the local phase modulation, so that the markings $A_i$ $B_i$, entirely transparent per se, are imaged by the objective 7 in the image plane 8 of the dark field and are therefore satisfactorily observed and detected. Camera tubes 9 or differential photodiodes 10 can be used for detecting imagings of the markings $A_i$, $B_i$.

Now in order to adjust the two glass plates a, b relative to each other, it is necessary to determine the relative position of the markings applied on these plates. For this purpose the plates are aligned independently of each other so that mutually corresponding markings $A_i$, $B_i$, of both plates a, b produce the desired value on a detector arrangement.

Such a detection is possible, e.g., with a camera tube 9. The mutually corresponding markings $A_i$, $B_i$ in this case are imaged onto a camera tube (Si-target Vidikon), whilst a diode emitting infra-red (890 nm), is used as luminous source 1.

Figure 3:
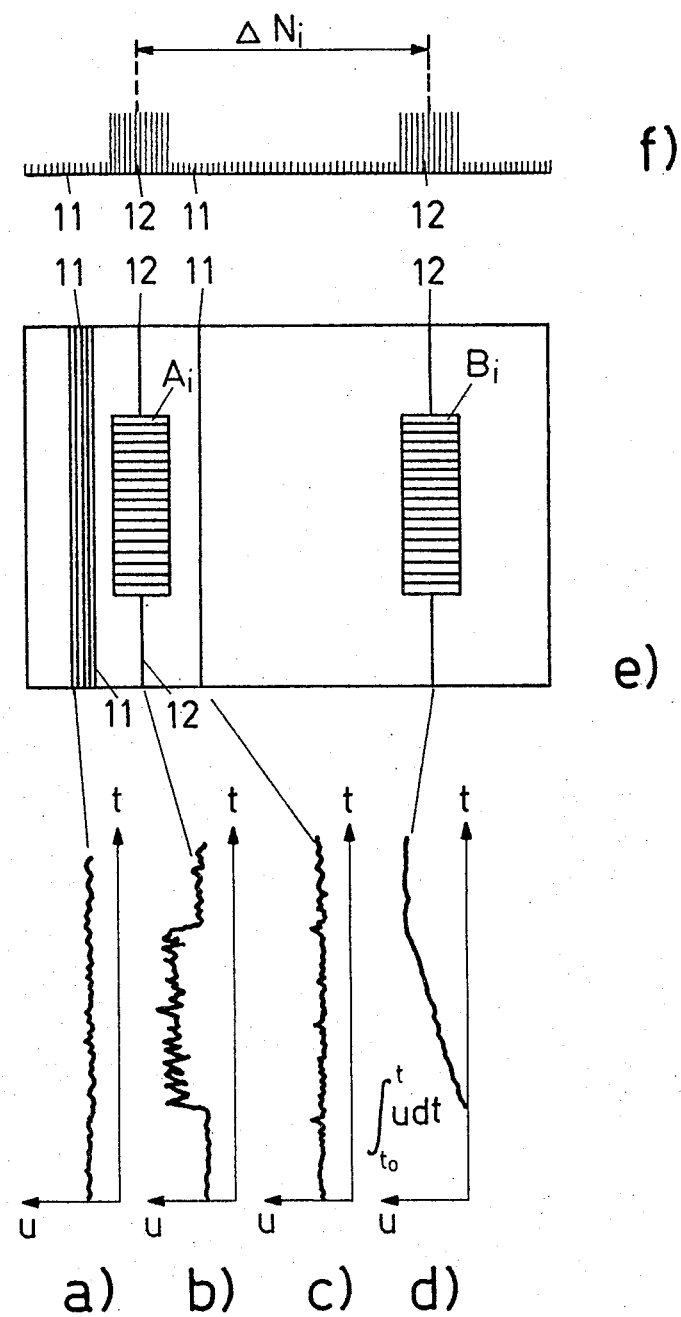
FIGS. 3a-3d are the amplitude vs. time characteristics of a signal U obtained by scanning the markings along a line and detecting the imaging obtained therefrom with a Vidikon.
FIG. 3e is a plan view of the imagings of the markings as they appear on a monitor.
FIG. 3f is a representation of the amplitude of the signal U scanned along a line as a function of the line number N.

By line-by-line scanning of the image plane 8, a time signal is produced which contains the information as to the intensity distribution prevailing in the image plane. Typical curves of the video signals are illustrated in FIGS. 3a, b and c. FIG. 3e shows the imaging of two mutually corresponding markings $A_i$, $B_i$ appearing on a monitor.

In order to determine the mutual position of the mutually corresponding markings $A_i$, $B_i$, it is sufficient in principle to determine the desired value by the number of scanned lines between the markings $A_i$ and $B_i$, because both the imaging scale and the scanning raster are constant. Due to the texture of the marking, by small scratches or other faults on the glasses, and system noise, the signal-to-noise ratio of the video signal is too unfavorable to perform a direct evaluation without signal processing. It is therefore recommended to perform an integration of the video signal along a line in order to average out the texture of the marking and in order to reduce the system noise. Whereas the integral of the video signal along a line 11 with no marking, e.g., according to FIGS. 3a and 3c, is approximately zero, in the case of a video signal which includes a line 12 with marking, a curve as shown in FIG. 3d is obtained. By means of a threshold value detector, it is thus easily possible to determine whether the video signal contains a marking or not. Thus due to the integration, it is impossible for minor errors, such as scratches or air bubbles in the glass inside or outside the markings, to produce any effect.

In order to eliminate further disturbing influences, such as slight modification of the marking width by the etching process or defocusing of the imaged marking due to thickness fluctuations in the glasses, it is advantageous to determine, not the number of lines between the imagings of the markings, but the number of lines from the centers of intensity of the image of the marking $A_i$ of the first glass plate a to the center of intensity of the marking $B_i$ of the second glass plate b. Then even oblique positioning of the markings and differential brightness (i.e., visibility) produce no errors in the evaluation.

The above disclosed mode of detection was performed with glass plates with intervals of up to 1 mm and produced in all cases an accuracy of 0.1% in the determination of the interval of the mutually corresponding markings. The time required for an evaluation including the standardization of the signals for a relevant adjusting member (e.g., a stepping motor on the mechanical adjusting device 3) was 60–80 ms.

Figure 4:
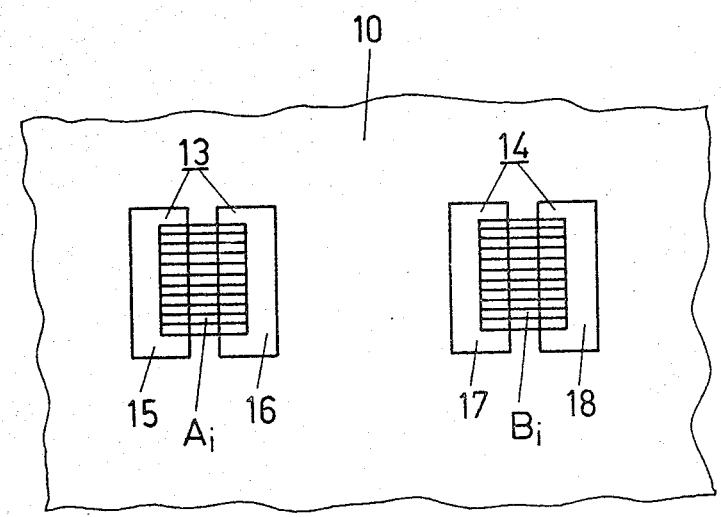
FIG. 4 is a plan view of a detector arrangement.

A determination and adjusting of the relative position of the glasses a, b can also be performed, instead of with a Vidikon 9, with differential photodiodes 10 arranged in the image plane 8 of the dark optical field. FIG. 4 illustrates a plan of such a detector arrangement. Here 13 and 14 designate the differential photodiodes for detecting the images of the markings $A_i$ and $B_i$. The reference numbers 15, 16, 17 and 18 designate the half-detectors respectively associated with the two photodiodes.

Such a detector arrangement 10 can now be fixedly mounted, or mounted on a sliding and rotating table. A different mode of functioning is obtained depending upon the form of mounting. In the case of the slidable detector arrangement 10, e.g., in a first step the differential photodiode 13 is brought into coincidence with the image of the marking $A_i$ of the fixed glass a, then the glass b is displaced in the mechanical adjusting device 3 until its marking $B_i$ corresponds to the differential photodiode 14 of the detector arrangement 10 which is now locked.

In the case of the fixed mounted detector arrangement 10, on the other hand, both the glasses a, b must be detected relative to the detector arrangement.

The two methods of detection are equivalent with respect to the resolution and precision which can be attained. With both methods, the two glass plates can immediately be adjusted relative to each other to an accuracy of 20 μm.

The sizes of the half-detectors 15, 16, 17 and 18 are preferably chosen so that an adequate integration of the intensity fluctuation which is dictated by marking texture of the marking $A_i$ or $B_i$ is obtained. Coincidence then exists between the detector arrangement 10 and the image of the marking $A_i$ or $B_i$ when equal signals different from zero appear at the half-photodetectors 15, 16, 17 and 18.

In order to permit observation of the adjustment process, it is recommended to provide a beam divider and an eyepiece in the optical system. A small He-Ne laser (red light) of approximately 1 mW power is particularly suitable as luminous source for the dark field 8.

Instead of adjusting the two glass plates, a, b by superimposition, it is also possible to align the plates in separate places with respect to the fixed coordinate system $(x, y, \phi)$, then to place them together and pass them to a retaining tool.

Figure 2:
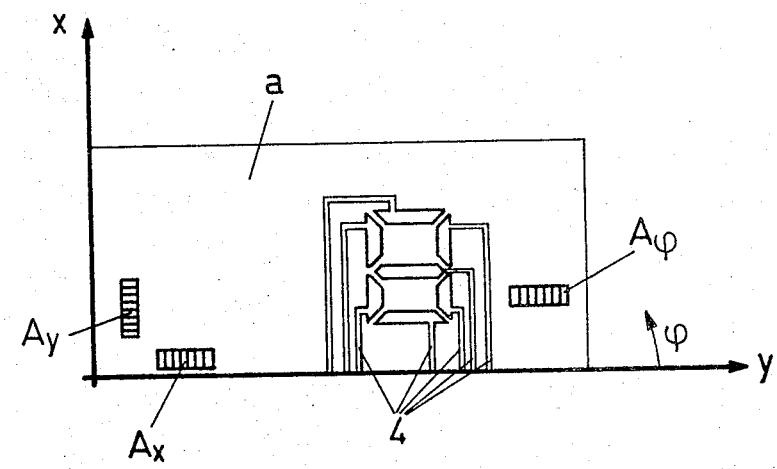
FIG. 2 is a plan view of glass plate of an LCD device provided with markings.

Instead of providing markings with the stripe pattern illustrated in FIG. 2, markings with any desired other textures may also be used as textured markings $A_i$. Thus, besides complicated grid and raster structures, the edges of the textured electrode layers, which should be augmented if desired by additional elements, e.g., a single stripe intersecting the edge of the electrode, may be used as particularly simple textures.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. In a method of adjusting the relative positioning of two planar transparent objects, and in particular the two glass plates of a liquid crystal display, said plates having transparent layer electrodes produced on said glass plates, the improvement comprising:
providing each of said planar transparent objects with transparent textured markings,
positioning said objects on a mechanical adjusting device,
emitting light from a luminous source through said objects, thereby generating a local phase modulation of said light passing through said markings,
rendering visible the resulting images of said markings produced by said local phase modulation in an optical dark field,
determining the positions of said objects by detecting said images of said markings in the image plane of said optical dark field by means of a camera tube, said determining step including electronically scanning the field of said camera tube to produce scan signals and integrating the scan signals to detect said images, and
aligning said objects in accordance with said positions determined from said detected images.

2. In a method of adjusting the relative positioning of transparent planar objects according to claim 1, the improvement of said steps of rendering said images visible and determining said positions further comprising:
imaging said images of said markings onto a camera tube in order to average out the center of intensity of said images,
scanning the field of said camera tube electronically line-by-line,
detecting signals representative of said images of said markings along each scanned line,
integrating said signals detected along each scanned line,
determining the intervals of said markings of said two objects by ascertaining the number of lines from the center of intensity of said images of said markings of one of said objects to the center of intensity of said images of said markings of the other of said objects.

3. In a method of adjusting the relative positioning of two planar transparent planar objects according to claim 1, the improvement of said step of determining said positions further comprising:
establishing a co-ordinate system $(x, y, \phi)$
detecting said image of said markings in the direction of one of said coordinates $(x, y, \phi)$.

4. In a method of adjusting the relative positioning of two planar transparent objects according to claim 1, the improvement of said step of positioning said objects further comprising:
establishing a fixed co-ordinate system $(x, y, \phi)$,
aligning said objects separately in said mechanical adjusting device in reference to said fixed co-ordinate system $(x, y, \phi)$,
placing said objects together, and
fixing said objects in a retaining device.

5. In a method of adjusting the relative positioning of two planar transparent objects according to claim 1, the improvement of said step of positioning said objects further comprising:
positioning said objects on said mechanical adjusting device so that said objects are independently moveable, parallel, and separated by a distance of not more than 1 mm.

6. In a method according to claim 1 of adjusting the relative positioning of planar transparent objects, and in particular the two glass plates of a liquid crystal (LCD) display having transparent layer electrodes produced on said plates, the improvement of said step of providing each of said planar objects, and in particular said glass plates, with said markings, further comprising:
etching said markings on said electrode layers when said layer electrodes are produced during said adjusting of said relative positioning of said glass plates.

7. An apparatus for adjusting the relative positioning of planar transparent objects, and in particular the two glass plates of a liquid crystal display (LCD) having transparent layer electrodes, said layer electrodes having transparent markings disposed thereon, comprising:

illuminating and imaging means for directing a collimated light beam through said transparent markings of said planar transparent objects, said light beam locally phase modulated as said light beam passes through said markings, said illuminating and imaging means comprising a luminous source, collimator means for beaming the light eminating from said luminous source, dark field stop means for intercepting light leaving said collimator means and passing through said planar transparent objects, and objective means for imaging said markings; and image detection means for detecting said images of said markings and for determining the position of said planar transparent objects, said image detection means comprising differential photodiode means for detecting said images of said markings and for determining said position of said objects, said differential photodiode means including a separate differential photodiode for each of said markings on both of said planar transparent objects.

8. An apparatus according to claim 7, wherein each of said separate photodiodes of said photodiode means comprises:
two half-detectors, each of said half-detectors dimensioned to enable a sufficient integration over the intensity distribution in space of said images of said markings.

9. An apparatus according to claim 7, wherein said illuminating and imaging means further comprises:
a monochromatic luminous source consisting of a He-Ne laser having an output power of approximately 1 mW.

10. An apparatus according to claim 7, wherein said illuminating and imaging means further comprises;
a luminous source consisting of an infra-red emitting diode.

11. In a method of adjusting the relative positioning of two planar transparent objects, and in particular the two glass plates of a liquid crystal display, said plates having transparent layer electrodes produced on said glass plates, the improvement comprising:
providing each of said planar transparent objects with transparent textured markings,
positioning said objects on a mechanical adjusting device,
emitting light from a luminous source through said objects, thereby generating a local phase modulation of said light passing through said markings,
rendering visible the resulting images of said markings produced by said local phase modulation in an optical dark field,
determining the positions of said objects by detecting said images of said markings in the image plane of said optical dark field by means of differential diodes arranged in the image plane of the dark field, each of said differential diodes provided for imaging of the markings of a respective planar transparent object, and
aligning said objects in accordance with said positions determined from said detected images.

12. In a method of adjusting the relative positioning of two planar transparent objects according to claim 11, the improvement of said step of determining said positions further comprising:
imaging each of the respective images of said markings of said one and said other of said objects onto a plurality of respective differential photodiodes.

13. In a method of adjusting the relative positioning of two planar transparent object according to claim 12, the improvement of said step of determining said positions further comprising:
mounting said first differential photodiode on a detector frame,
sliding and rotating said detector frame until said first differential photodiode is brought into coincidence with said images of said markings of said one of said objects, and
displacing said other of said objects until said second differential photodiode is brought into coincidence with said images of said markings of said other of said objects.

14. In a method according to claim 12, the improvement of said imaging means further comprising:
imaging each of the marking images on a respective differential photodiode formed of two half detectors, each of which is dimensioned to enable a sufficient integration over the intensity distribution in space of said images of said markings.

* * * * *